United States Patent [19]

Salzman et al.

[11] Patent Number: 4,674,096
[45] Date of Patent: Jun. 16, 1987

[54] LATERAL COUPLED CAVITY SEMICONDUCTOR LASER

[75] Inventors: Joseph Salzman; Robert J. Lang, both of Pasadena; Amnon Yariv, San Marino, all of Calif.

[73] Assignee: California Institute of Technology, Pasadena, Calif.

[21] Appl. No.: 707,672

[22] Filed: Mar. 4, 1985

[51] Int. Cl.$^4$ .......................... H01S 3/08; H01S 3/10
[52] U.S. Cl. ........................ 372/50; 372/20; 372/46; 372/97
[58] Field of Search .................. 372/50, 46, 92, 97, 372/20, 19, 8

[56] References Cited

U.S. PATENT DOCUMENTS 4,284,963  8/1981  Allen, Jr. et al. ................ 372/50

FOREIGN PATENT DOCUMENTS 0199586  11/1986  Japan ................................ 372/50

OTHER PUBLICATIONS

J. K. Carney et al, "Double-Heterojunction Laser Diodes with Multiply Segmented Contacts", Appl. Phys. Lett. 38(5), Mar. 1, 1981, pp. 303-305.

C. H. Henry and R. F. Kazarinov, Stabilization of Single Frequency Operation of Coupled-Cavity Lasers, IEEE Journal of Quantum Electronics, vol. QE-20, No. 7, Jul. 1984, pp. 733-744.

Primary Examiner—James W. Davie
Attorney, Agent, or Firm—Freilich, Hornbaker, Rosen & Fernandez

[57] ABSTRACT

Two or more parallel waveguide lasers of different effective length are coupled together by their evanescent waves such that the composite structure functions as a single cavity having a longitudinal mode with resonances related to the resonances of the separate cavities. A very strong selection of the composite operating frequency, and suppression of most or all of the other longitudinal modes, with frequency tuning of the composite structure (both continuously and by mode hopping), can be accomplished by varying the relative currents supplied to each laser. Upon holding one cavity at one current level for a selected operating point and shifting the other, bistable operation can be achieved.

8 Claims, 11 Drawing Figures

CLEAVED COUPLING

FIG. 1(d) CLEAVED COUPLING

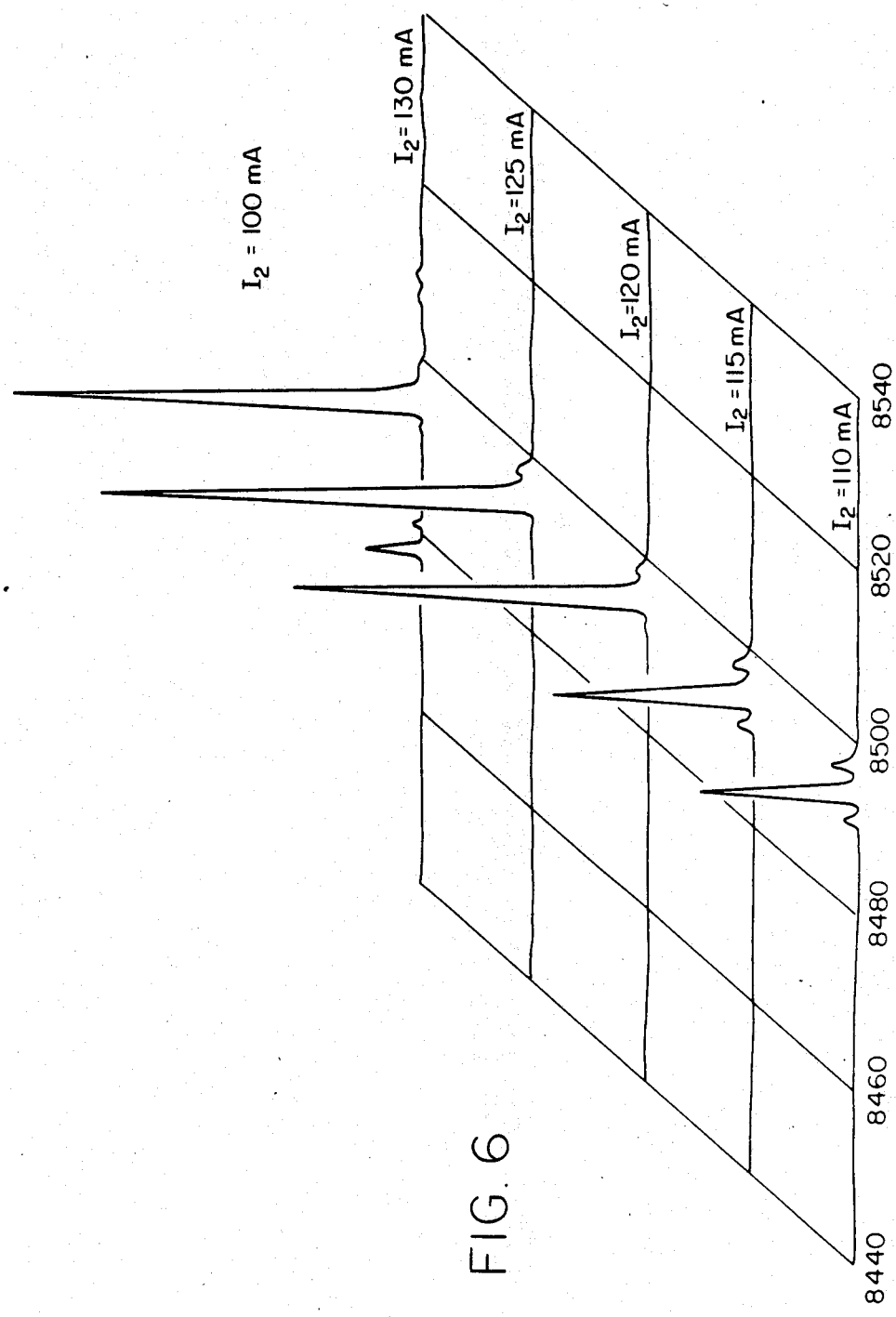

LATERAL COUPLED CAVITY SEMICONDUCTOR LASER

ORIGIN OF INVENTION

The invention described herein was made in the performance of work by California Institute of Technology, Pasadena, Calif. under a Grant No. ECS-8412255 with the National Science Foundation, and under Contract No. N00014-85-K-0032 with the office of Naval Research.

BACKGROUND OF THE INVENTION

This invention relates to waveguide lasers, and more particularly to two or more parallel waveguide lasers of different effective length coupled to each other for phase locking with selection of the frequency, and suppression of other longitudinal modes, and with frequency tuning.

Coupled cavity lasers have been used for frequency selection in a wide variety of multiresonator design. In the case of semiconductor lasers, coupled cavity resonators have deserved special attention since they offer the capability of stable single mode operation over a wide range of modulation conditions, frequency tunability and output power control. The effect of coupling two cavities in these devices is to interferometrically modulate the gain and loss of the composite resonator resulting in enhancement of lasing action at those frequencies in which the resonances of the two cavities reinforce each other. This results in frequency selectivity.

An additional improvement is to provide a separate electrical contact for the cavities to allow a desirable electronic control of the output spectrum by changing the gain and index of refraction in each cavity. Such a structure has been implemented in the cleaved-coupled cavity laser on which intensive analytical and experimental efforts have been invested. See "Stabilization of Single Frequency Operation of Coupled-Cavity Lasers" by Charles H. Henry, et al., IEEE J. Quantum Electron., Vol. QE-20, pp 733-744, 1984, and papers cited therein. However, the performance of such lasers depends in a critical way on the dimensions of the air gap between cavities. That gap has to be adjusted with tolerances of the order of a small fraction of the lasing wavelength. This creates a significant problem in the fabrication process of the device.

It would be desirable to achieve the frequency selectivity in lateral coupled laser structures, like phase-locked laser arrays, to avoid the need to adjust an air gap between cavities. However, most of the analyses of phase-locked arrays have been related to the lateral modes of the structure (supermodes), and no attention has been paid to the longitudinal mode selection that can be achieved by phase-locking parallel lasers of different effective optical lengths.

The present inventors recently performed a first analysis of the longitudinal resonances of two laterally coupled semiconductor lasers, and showed that when the reflectivity of the two mirrors differs, thereby making their effective length different, the two supermodes are coupled in a way similar to that in which two cavity modes are coupled in a cleaved-coupled cavity laser. These results are enhanced in the case of two cavities of different physical lengths.

SUMMARY OF THE INVENTION

The present invention of a lateral coupled cavity laser consists of two or more parallel waveguide lasers of different effective length of at least one with respect to the other(s) fabricated on any semiconductor structure suitable for injection lasers (e.g., GaAs compounds, InP and quaternary compounds, Pb-salt compounds, etc.). These waveguide lasers are made in a monolithic structure in close proximity to each other, with equal or very similar waveguide parameters in order to favor the coupling of radiation between neighboring waveguides. At one end, the structure has a planar mirror which provides equal reflectivity to all the waveguide lasers. At the other end, the waveguide lasers are terminated at different effective lengths by mirrors provided in a suitable way.

In a particular case of two or three coupled laser cavities of different physical length, one waveguide laser is provided with a length $L_1$ using planar mirror, and the other waveguide laser(s) is (are) provided with a length $L_2 < L_1$ using an etched planar mirror. Each waveguide laser is provided with a separate electrical contact. An additional separate electrode may be provided for a portion of the longer of the two or three waveguide lasers extending beyond the shorter waveguide laser to separately control that portion which extends beyond the adjacent one or two waveguide lasers.

In the case of more than three waveguide lasers coupled together, the length of each laser can be chosen such that maximum frequency selectivity of the device can be achieved. The electrical contact can be a single one, or two or more separate contacts for two or more groups of waveguides. Also, the extra length in the longer laser (or lasers) can be provided with a separate contact in order to electronically adjust the effective optical length of three stripes.

The novel features of the invention are set forth with particularity in the appended claims. The invention will best be understood from the following description when read in conjunction with the drawings.

BRIEF DESCRIPTION OF THE DRAWINGS

FIG. 6 illustrates single mode operation of the structure of FIG. 1(a) with continuous tuning achieved by changing the current supplied through one of the stripe contacts to one laser cavity.

DESCRIPTION OF PREFERRED EMBODIMENTS

Figure 1A:
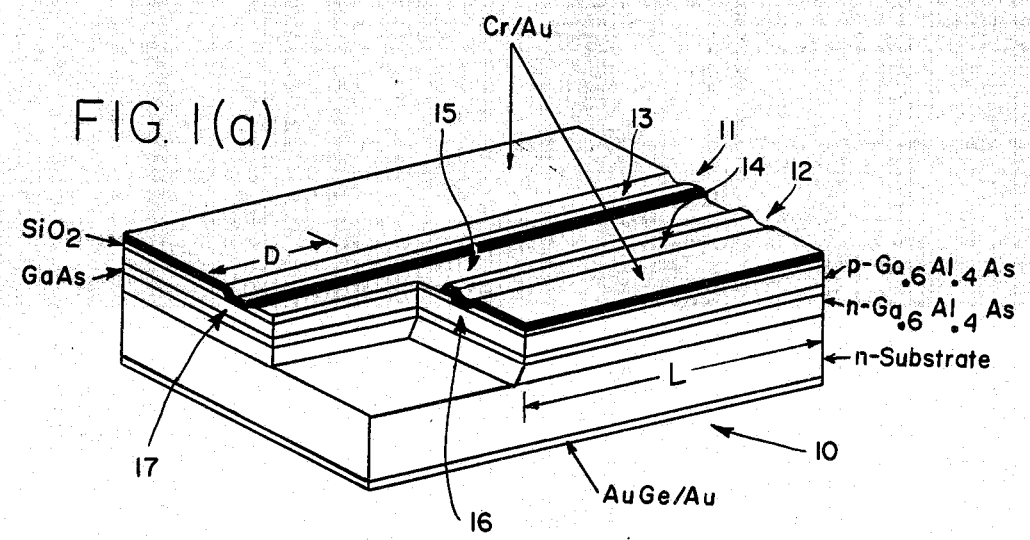
FIG. 1(a) is an isometric view of a lateral coupled cavity semiconductor laser having one of two stripe laser cavities shorter than the other and an etched facet for one end mirror for the shorter cavity. Each laser cavity is provided with a separate strip contact for independent control of current supplied to each from an adjustable constant current source FIGS. 1(b) and (c) are schematic diagrams illustrating the shape of a mask used to etch the mirror for the shorter cavity.

FIG. 1(a) illustrates the simplest device 10 embodying the present invention. Comprised of two phase-locked stripe lasers 11 and 12 of different physical length, and with control contacts 13 and 14 electrically separated by a gap 15. In this device only one mirror 16 for the shorter waveguide laser 12 need be etched; the other end mirrors may be provided by cleaving, like end mirror 17, for the longer waveguide laser 14. However, the development of new etching techniques that result in smooth planar laser mirrors can lead to a fully etched device in an optoelectronic integrated system.

To produce the device of FIG. 1a, double heterostructure GaAs/GaAlAs (DH) wafers were grown by liquid phase epitaxy and laser stripes 4 $\mu$m wide and with 9 $\mu$m center separation were delineated by proton implantation. All the steps in the fabrication of cleaved laser arrays are well known, and published in the literature. The only additional step is the selective etching of all or part of the waveguide mirrors. This can be done by standard photolithography techniques, that is masking the device, and then etching the exposed regions to form a smooth mirror-like facet. The etching of this mirror 16 in one of the stripes can be accomplished either by chemical etching or by the hybrid wet and reactive ion etching techniques. In both cases, the etching is started by chemical etching.

The mask undercut by chemical etching produces a rounded corner near the laser stripe. The shape of the mask 20 is indicated by the shaded area in FIG. 1(b) and the shape of the under cut facet 22 is indicated by a dotted line. FIG. 1(c) shows, in a section on line c—c in FIG. 1(b), the undercut mask. In that manner, as material is etched from an area 24 exposed to etchant, an undercut is produced beneath the mask which, by the time the etching process has gone through the active region (about 1 to 2 $\mu$m in a solution of one part $H_2SO_4$, eight parts $H_2O_2$, and one part $H_2O$ by volume at $-2°$ C. for 6 min., 20 sec.), there will be a planar facet perpendicular to the stripe laser 12 to provide a 3-$\mu$m wide planar mirror perpendicular to the optical axis of the laser 12. For these dimensions, the radius of curvature for the curved portion of the mask opening is selected to be 150 $\mu$m.

Figure 1B:
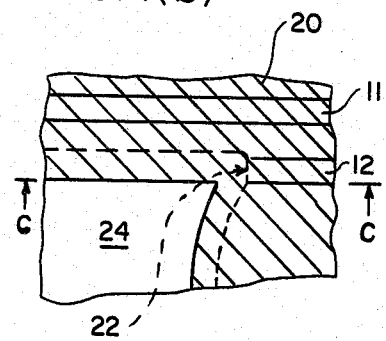
FIG. 1(d) illustrates schematically the device of FIG. 1(a) with a separate contact for independent current control of the portion of a longer waveguide laser that extends beyond the shorter one, and also illustrates schematically a device in which the longer one of the laser waveguides is cleaved to provide a section of equal length to the shorter ones of the lasers, with equal or different currents applied through both portions.
FIG. 1(e) is a plan view of a lateral coupled cavity semiconductor laser having three parallel stripe laser cavities in close proximity with two stripe laser cavities shorter than the third one, each with a separate stripe contact.
Figure 1C:
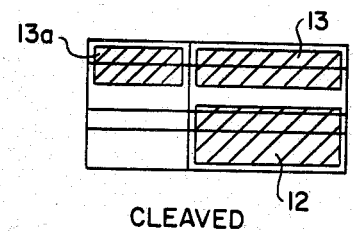
Figure 1C:
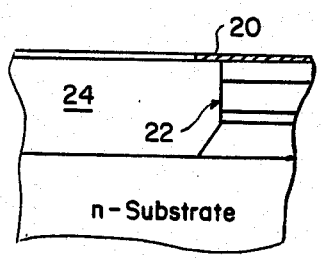

A mask 20 was designed for etching the mirror 16 in FIG. 1(b). The shape of the mask is such that after a few microns of undercut, the shape of the etched facet across the stripe laser 12 is merely perpendicular thereto. To assure that the etched facet will be perpendicular to the stripe laser (i.e., vertical with respect to the substrate), a hybrid wet and reactive ion etching technique is used.

In the case of GaAs/GaAlAs high selectivity in the etching using a freon-12 plasma has been demonstrated. Good etch rates (0.1-0.5 $\mu$m/min) have been obtained with vertical walls in GaAs, even at pressures as high as 15-20 $\mu$m, using a mixture of freon-12 ($CCl_2F_2$), helium and oxygen. At these pressures the GaAlAs on the surface is etched at a rate which is more than one order of magnitude smaller than that of GaAs. The high pressure etching has a further advantage—generally increasing gas pressures and the lowering of substrate temperatures leads to smoother etching.

This selectivity is used in making laser facets for the devices of the present invention, by first wet-etching grooves (with orientational preference) in the heterostructures and then using the edges of the etched GaAlAs layers as masks in the dry-etching of the GaAs active layer. A thin $Ga_{0.6}Al_{0.4}As$ layer is added at the top of the double heterostructure (DH) grown by liquid phase epitaxy for protecting the GaAs($p^+$) contact layer (not shown) during the RIE.

The layers are wet-etched using a mixture of $H_2SO_4$, $H_2O_2$ and $H_2O$, resulting in orientation dependent profiles. When the (100) plane of GaAs is etched with mask openings oriented along the [011] or [01$\bar{1}$] directions, the groove profiles are determined by the preferential etching of (111) and ($\bar{1}$11) planes (V-groove) or of the ($\bar{1}\bar{1}$1) and ($1\bar{1}\bar{1}$) planes (dove-tail groove), respectively. When a DH is etched in the $H_2SO_4$—$H_2O_2$—$H_2O$ system, the angle of the groove sidewalls changes with Al concentration, the etchant composition and the etching temperature. For $Ga_{0.6}Al_{0.4}As$ etched with $H_2SO_4$:-$H_2O_2$ (30% by weight):$H_2O$ (1:8:10) at 25° C. near vertical profiles are obtained along the (011) direction in the GaAlAs upper cladding layer. The GaAs active layer is etched with a positive slope. The sample is then etched in a plasma under the conditions described above. The GaAlAs layers act as masks and the GaAs layers are etched with a vertical planar facet. Because of the higher pressures under which the layer is etched the facet is expected to have a smoother surface. This technique is most suitable when the active layer is thick (>0.3 $\mu$m) so that a significant portion of the lasing mode is confined in the active layer. With the perpendicularly wet etched top cladding layer the effective reflectivity of the facet is further improved.

After the mirror groove is wet-etched by using the 1:8:10 etch solution, the sample is reactive ion-etched in a diode plasma etch station. The top and bottom electrodes are covered with 6" diameter silicon wafers. An etch gas consisting of freon-12:He:$O_2$ is used at a pressure of 15-20 $\mu$m at a plasma power density of 0.15 W/cm$^2$. The GaAs etch rate is 0.2 $\mu$m/min under these conditions. By utilizing a 1/16" thick quartz plate over the bottom electrode, the etch rate is increased by over a factor of two under identical conditions.

After the plasma etching, good vertical facets are obtained near the contact layer, active layer and the substrate. In all these regions the GaAlAs upper layers act as a plasma etch mask. At lower pressures (~5 mTorr) required to etch GaAlAs, the etched surfaces would be significantly rougher illustrating the advantage of this higher pressure technique. After etching vertical walls in the GaAs (active) layer by RIE, a further chemical polishing is done by a dip etch in $H_2SO_4:H_2O_2:H_2O$ (4:1:1). Lateral coupled cavity lasers are then fabricated from wafers prepared in this way.

The separate control contacts 13 and 14 are provided by vapor deposition of two Cr/Au stripes with contact pads on the upper (p) side. The fabrication process is completed by vapor deposition of AuGe/Au on the reverse (n) side, and cleaving the mirror 17 and the mirrors at the other ends of the lasers 11 and 12. The length of the longer waveguide laser 11 determined by cleaving it in the range of 220-400 μm, while the length of the shorter waveguide laser 12 determined by etching it in the range of 200-350 μm.

Referring to FIG. 1(d), the longer of the two lateral coupled cavity lasers 11 may have a separate contact 13a for the portion that extends beyond the shorter cavity laser 12. This allows for electronic adjustment of the effective optical length of the longer cavity laser 11.

Figure 1E:
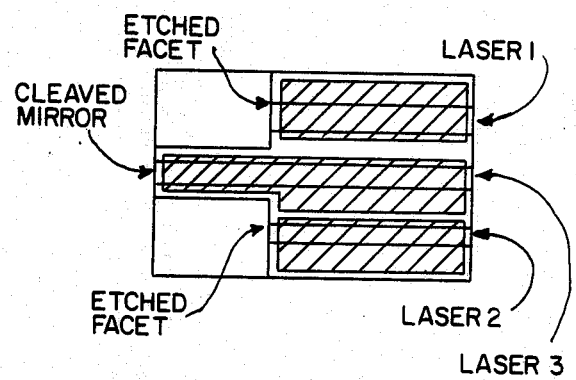

Only two stripe laser cavities are illustrated by way of example in FIGS. 1(a) through 1(d). In practice, there may be three, as shown in FIG. 1(e), or more. The effective optical length of each laser cavity can be chosen for maximum frequency selection from the composite structure. In the case of two or three laser cavities, the longer one may be cleaved even with the shorter one or two, as shown in FIG. 1(d), in order to provide the shorter one or two laser cavities with cleaved mirrors at both ends. The two portions of the longer one are then cleave coupled. While this will produce frequency selectivity in the longer cavity laser, the independent operation of the shorter cavity laser will provide for further frequency selection and tuning in accordance with the present invention.

Figure 2A:
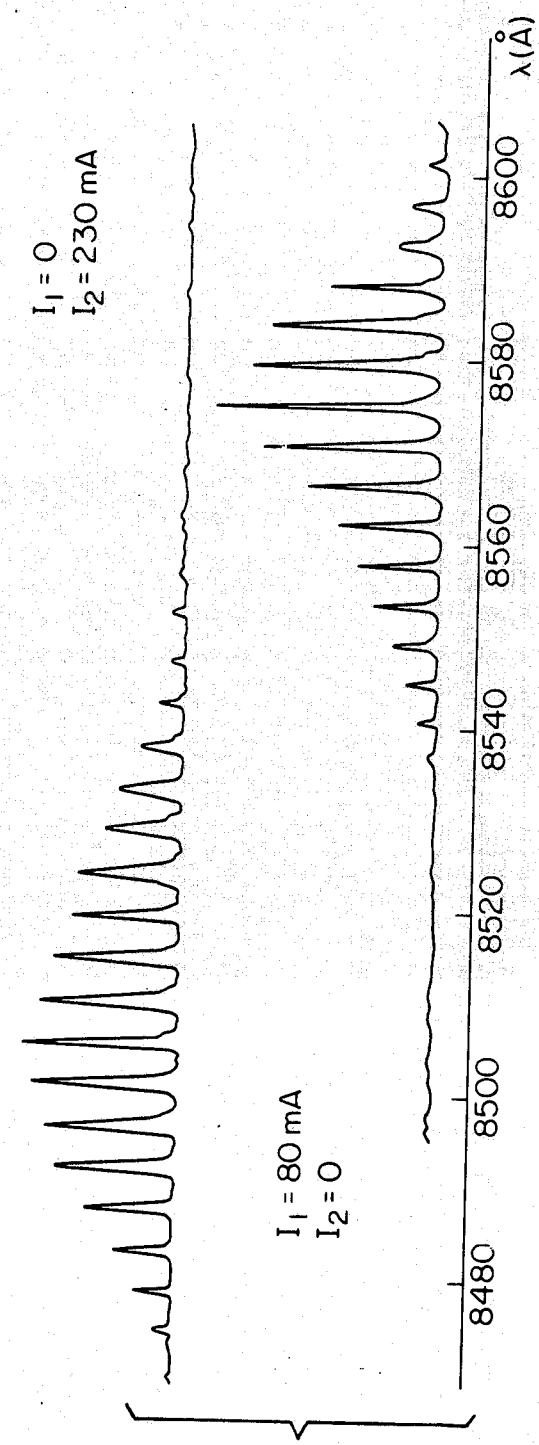
FIG. 2(a) illustrates a longitudinal mode spectrum of each laser in the structure of FIG. 1(a).

In FIG. 2(a), the longitudinal mode spectra of each stripe laser 11 and 12 of FIG. 1(a) is plotted, and a slight difference in the mode spacing (corresponding to the difference in length) can be noticed.

The longitudinal modes of the lateral coupled cavities are given by the solutions of the following equation:

$$\left[\frac{\exp(2j\sigma_1 L)}{r_1^*} - 1\right] \left[\frac{\exp(2j\sigma_2 L^*)}{r_2^*} - 1\right] = K_s$$

where:

$$r_1^* = \frac{r_1}{2}(1 + \alpha) + \frac{r_2}{2}(1 - \alpha)e^{-2j\beta_3 D}$$

$$r_2^* = \frac{r_2}{2}(1 + \alpha) + \frac{r_1}{2}(1 - \alpha)e^{+2j\beta_3 D}$$

$$L^* = L + \frac{\beta_3}{\sigma_2} D$$

$$K_s = (1 - \alpha^2)[r_2 e^{-j\beta_3 D} - r_1 e^{j\beta_3 D}]^2/r_1^* r_2^*$$

$$\alpha = \frac{\beta_2 - \beta_1}{2 - 1}$$

$\beta_{1,2}$, $\sigma_{1,2}$ are the waveguide propagation constants and the supermode propagation constants, respectively.

$\beta_3$ is the propagation constant in the additional single channel section.

$r_1, r_2$ are the mirror reflectivities.

Figure 2B:
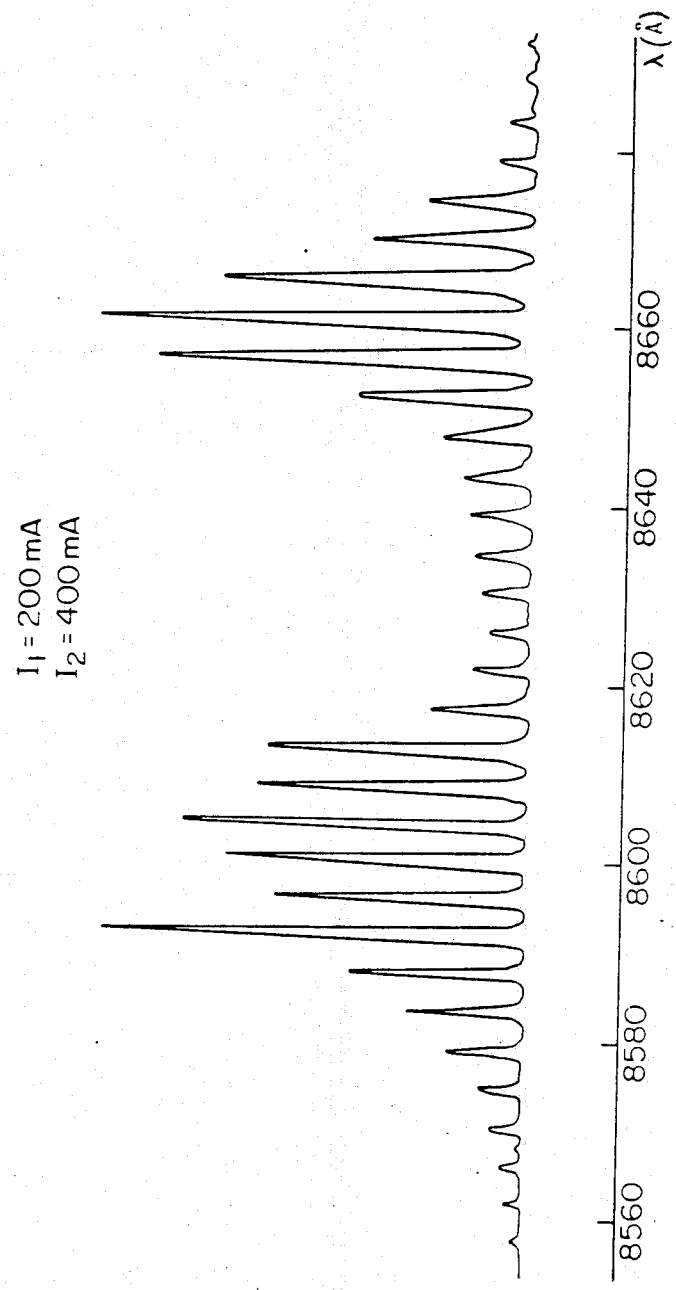
FIG. 2(b) illustrates a spectrum of the structure of FIG. 1(a) well above threshold.
Figure 3:
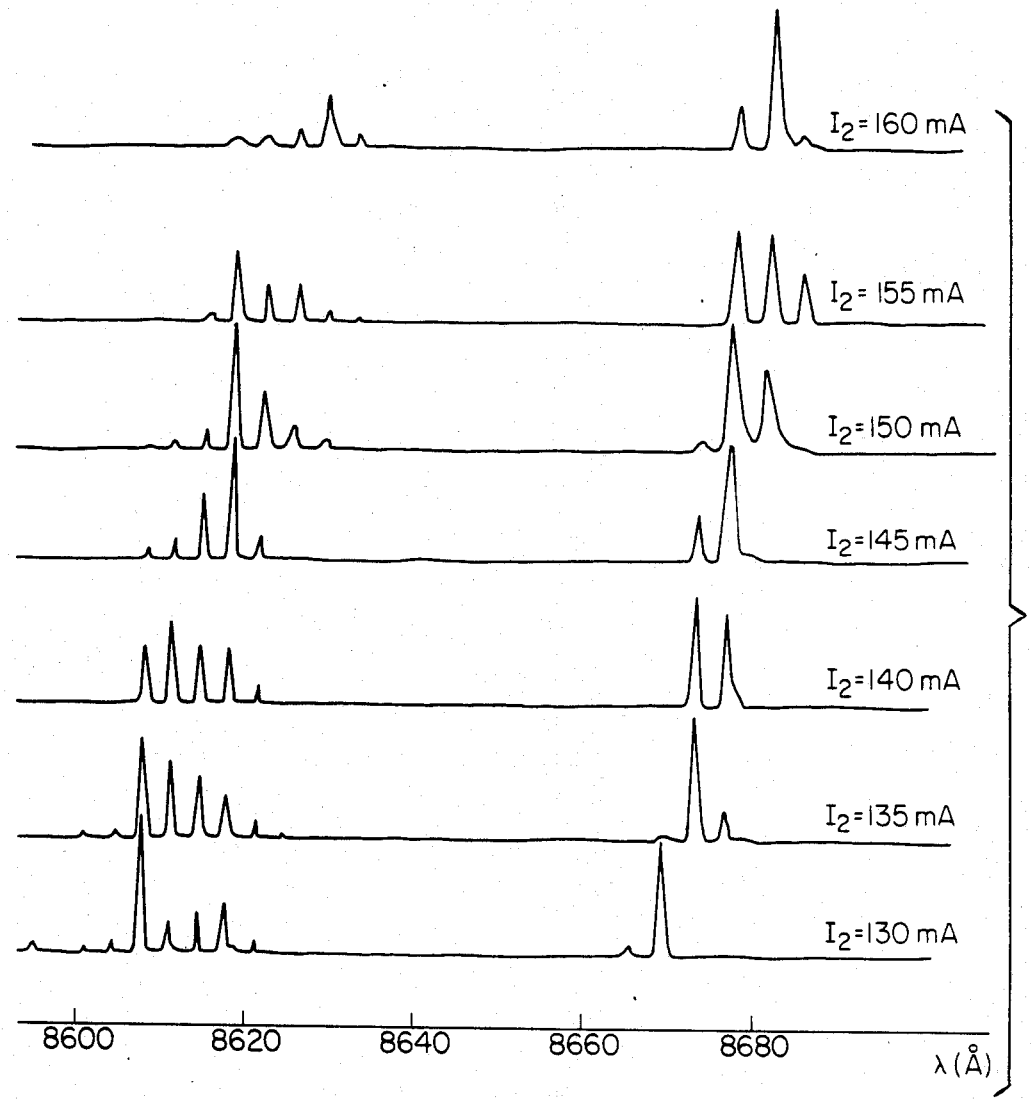
FIG. 3 illustrates a longitudinal mode spectra of the structure in FIG. 1(a) with the current supplied through one stripe contact to a laser cavity fixed, and different values for the current supplied through the other stripe contact to the other laser cavity.

In FIG. 2(b), the spectrum of the coupled lasers well above threshold is plotted. This shows the effect of gain and loss modulation that results from the interaction between the supermodes of the two lasers 11 and 12. The spectrum is shifted toward longer wavelengths and the envelope of the multimode pattern has two peaks at $\Delta\lambda \sim 70$ Å, corresponding to the difference in the optical length ($\sigma_1 L - \sigma_2 L^*$). By varying the current in each channel, the relative phase between the two supermodes is altered, leading to the continuous shift of the mode-envelope shown in FIG. 2(b). This is demonstrated in FIG. 3, and may be used in gain guided devices as a method for wide range tuning by mode hopping resulting from a change in current $I_2$ to the second laser while the control current $I_1$ for the first laser is held constant, thus shifting the spectrum of the second laser, and consequently shifting the spectrum of the coupled lasers as shown in FIG. 3.

Figure 4:
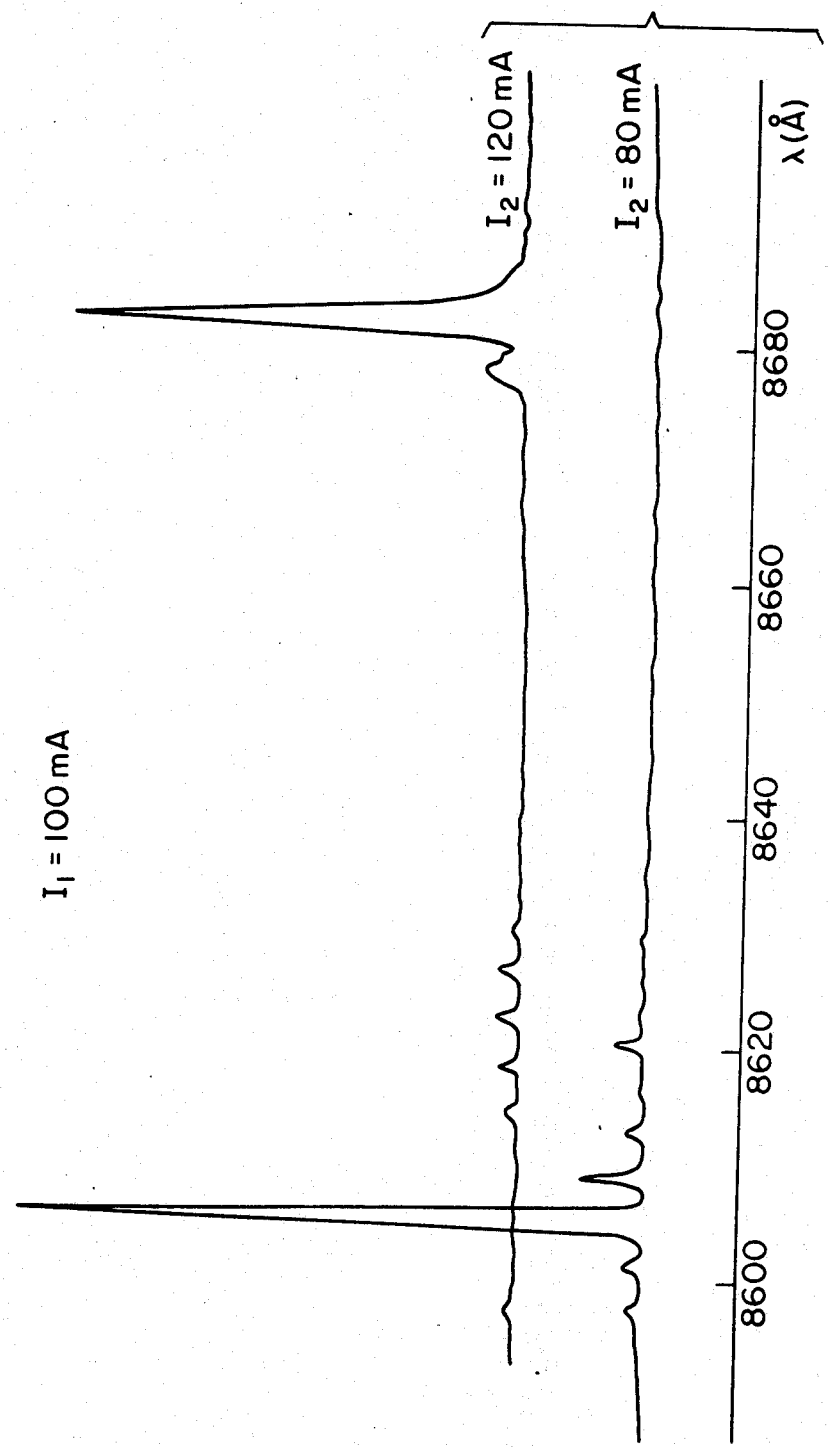
FIG. 4 illustrates the switching between two stable, nearly single, mode operation points.
Figure 5:
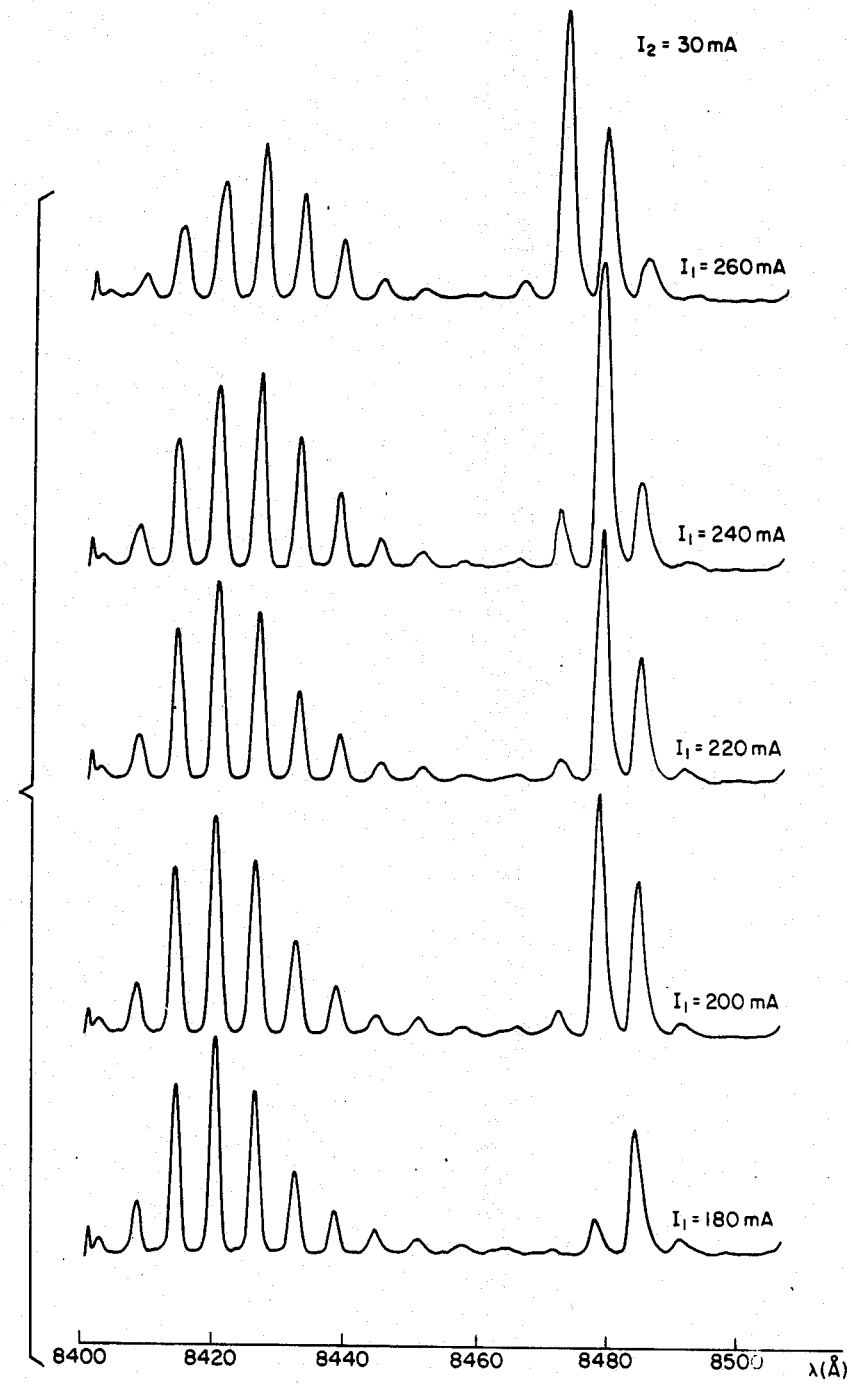
FIG. 5 illustrates a longitudinal mode spectra of the structure in FIG. 1(a) for different values of the current supplied through one of the stripe contacts to one laser cavity, showing variations in the wavelength spacing between the two peaks.

In FIG. 4, a different operating point is chosen to demonstrate switching between two nearly single mode settings at ~70 Å apart. The longitudinal mode selection and tuning characteristics shown in FIGS. 2, 3 and 4 are all measured from a single device, with L=300 μm and D=40 μm. Additional interesting properties were observed in other devices, for example, in a L=150 μm, D=150 μm device the tuning of the mode envelope shown in FIG. 5 was measured with the shorter laser being operated under threshold. It is apparent here that the difference in wavelength between the two peaks of the mode envelope is changing significantly. This fact can be explained on account of the dependence of ($\sigma_2 - \sigma_1$) on the individual channel propagation constants $\beta_{1,2}$ and their coupling coefficient. For two strongly coupled lasers, ($\sigma_2 - \sigma_1$) >> ($\beta_2 - \beta_1$) and then small changes $\beta_1$ and $\beta_2$ induced by changes in the gain can lead to noticeable variation in ($\sigma_1 L - \sigma_2 L^*$).

In FIG. 6, an example is presented of single mode operation with continuous tuning, while the output power changed by a factor of 2.5. In this experiment the individual lasers were deliberately designed as gain guided structures, possessing a multimode spectrum. Yet, the spectra shown in FIG. 6 demonstrate that operating points can be found at which the lateral coupled cavity laser emission is in a single mode, with very high stability against changes in injection current (modulation) or temperature.

When each of the two stripe laser cavities is operated individually, its longitudinal modes are determined by the round trip resonance condition. Therefore, the spectrum of the output emission is in the form of several sharp peaks corresponding to individual modes. The spectral spacing between the peaks is determined by the total length of the isolated laser. If two different lasers are of different lengths, their longitudinal modes are spaced differently as shown in FIG. 2(a). When both lasers are operated together, their radiation is coupled to each other by the evanescent waves. This causes phase locking between lasers and the composite structure can be regarded as a single cavity having a longitudinal mode shown in FIG. 2(b). The resonances of this composite cavity are related to the resonances of the original (isolated) cavities. The effect of coupling the cavities is to modulate the gain of the composite resonator, resulting in a dramatic enhancement of lasing emission at those frequencies in which the isolated cavities are resonant with each other. Thus, coupled cavity lasers of different lengths can produce a very strong selection of the operating frequency and suppression of most or all of the other longitudinal modes. Frequency tuning (both continuously and by mode hopping) can then be accomplished by varying the relative currents supplied to each laser. Bistability and switching between two different frequencies can also be obtained by choosing the operating point of the coupled stripe lasers to be midway between the selection of two distinct longitudinal modes. By tuning the lasers to shift the operating point more toward one or the other of the two longitudinal modes, very strong selection of one mode can be made and retained until frequency tuning shifts the operating point in the opposite direction for selection of the other longitudinal mode.

In summary, lateral coupled cavity lasers of different effective lengths have an inherent frequency selection capability that results from the modulation of the gain losses in different longitudinal modes. The loss modulation is a result of the coupling of the cavity supermodes. Frequency tuning or highly stable single mode operation can also be achieved by properly choosing the operating point of the coupled cavity lasers.

The specific example given utilizes two waveguide lasers of different actual lengths, but the invention may also be practiced by making lasers of different effective lengths, such as by making their end mirrors of different reflectivity. Different actual lengths is preferred because phase locking is achieved with very strong selection of the frequency and frequency tuning over a wide range. For stronger selection and tuning over a wider range, three, or more, waveguide lasers may be coupled.

Although particular embodiments of the invention have been described and illustrated herein, it is recognized that modifications and variations may readily occur to those skilled in the art. For example, although a GaAs/GaAlAs structure has been described and illustrated, other semiconductor structures may be made with the same advantage. Consequently, it is intended that the claims be interpreted to cover such modifications and variations.

What is claimed is:

1. A monolithic lateral-coupled laser array comprised of at least two stripe laser cavities of different effective length in close parallel proximity to each other for coupling of radiation therebetween, the longer of said stripe laser cavities being cleaved to provide separate parts, and the parts are cleaved coupled to form one stripe laser cavity lateral coupled to the shorter laser cavity, and separate stripe contact for varying the relative currents supplied to each laser cavity, including the cleaved coupled cavities of the longer of said stripe laser cavities.

2. A monolithic lateral-coupled cavity semiconductor laser as defined in claim 1 wherein said different effective length is achieved by a difference in actual length of one laser cavity with respect to another.

3. A monolithic lateral-coupled cavity semiconductor laser as defined in claim 2 wherein each laser cavity is comprised of active semiconductor material under separate and parallel stripe contacts with cleaved mirrors at each end except the shorter laser cavity, said shorter laser cavity having at least one etched facet for an end mirror.

4. A monolithic lateral-coupled cavity semiconductor laser as defined in claim 2 wherein the longer of said stripe laser cavities is cleaved even with the shorter one of said stripe laser cavities.

5. A monolithic lateral coupled cavity semiconductor laser array comprised of at least two stripe laser cavities of different length in close parallel proximity to each other for coupling of radiation therebetween, and separate stripe contacts for varying the relative currents supplied to each laser cavity, wherein the longer of said stripe laser cavities is provided with a separate stripe contact for that portion thereof that extends beyond the length of the shorter stripe laser cavity.

6. A method for tuning an array of stripe lasers comprising the steps of making the effective length of at least one stripe laser longer than the effective length of other stripe lasers, laterally coupling said stripe lasers, and controlling the current supplied to said one stripe laser in sections independent of each other independently of currents supplied to each of the remaining stripe lasers of the array.

7. A method as defined in claim 6 wherein said one of said stripe lasers is of greater actual length, and current supplied to said stripe laser of greater actual length is independently controlled in two sections, one section being of substantially the same length as a shorter stripe laser of said array and the other section comprising the remaining length of said one stripe laser.

8. A method as defined in claim 7 wherein sections of said one stripe laser are cleave coupled.

* * * * *